(12) United States Patent
Park et al.

(10) Patent No.: US 7,619,928 B2
(45) Date of Patent: Nov. 17, 2009

(54) SEMICONDUCTOR MEMORY DEVICE INCLUDING FLOATING BODY MEMORY CELLS AND METHOD OF OPERATING THE SAME

(75) Inventors: Duk-Ha Park, Suwon-si (KR); Ki-Whan Song, Yongin-si (KR); Jin-Young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 166 days.

(21) Appl. No.: 11/943,653

(22) Filed: Nov. 21, 2007

(65) Prior Publication Data

US 2008/0130376 A1 Jun. 5, 2008

(30) Foreign Application Priority Data

Nov. 24, 2006 (KR) ...................... 10-2006-0117028

(51) Int. Cl.
G11C 11/03 (2006.01)
(52) U.S. Cl. ............................. 365/185.18; 365/185.26; 365/189.07; 365/203; 365/207
(58) Field of Classification Search ............ 365/185.18, 365/185.26, 189.07, 203, 207
See application file for complete search history.

(56) References Cited

U.S. PATENT DOCUMENTS 5,526,307 A 6/1996 Yiu et al.
5,933,366 A * 8/1999 Yoshikawa ............. 365/185.03
6,567,330 B2 5/2003 Fujita et al.
6,882,008 B1 4/2005 Ohsawa
7,330,386 B2 * 2/2008 Kuroda et al. ............... 365/203
2003/0231524 A1 12/2003 Ohsawa
2005/0068807 A1 3/2005 Ohsawa

FOREIGN PATENT DOCUMENTS

| JP | 2004-119937 | 4/2004 |
|----|-------------|--------|
| JP | 2005-108341 | 4/2005 |
| KR | 100215866 B1 | 5/1999 |

* cited by examiner

Primary Examiner—Pho M. Luu
(74) Attorney, Agent, or Firm—Volentine & Whitt, P.L.L.C.

(57) ABSTRACT

A semiconductor memory device includes first and second memory cells having floating bodies, each of which includes a gate connected to a word line and an electrode connected to a common source line to store data. A controller applies a first voltage to the common source line, a negative second voltage to the word line, a third voltage as a first sense enable control voltage and the first voltage as a second sense enable control voltage during a first write period of a write operation. The controller also applies a fourth voltage to the common source line and the first voltage to the word line during a second write period of the write operation. The sensing portion amplifies a bit line and an inverted bit line to the third voltage or the first voltage, respectively, during the first write period in response to the first and second sense enable control voltages.

20 Claims, 4 Drawing Sheets

SEMICONDUCTOR MEMORY DEVICE INCLUDING FLOATING BODY MEMORY CELLS AND METHOD OF OPERATING THE SAME

A claim of priority is made to Korean Patent Application No. 2006-0117028, filed Nov. 24, 2006, the subject matter of which is hereby incorporated by reference.

BACKGROUND OF THE INVENTION

1. Field of the Invention

The present invention relates to a semiconductor memory device, and more particularly, the present invention relates to a semiconductor memory device having floating body memory cells and a method of operating the same.

2. Description of Related Art

In general, a dynamic random access memory (DRAM) device, which is one type of semiconductor memory device, includes a dynamic memory cell that includes a transistor and a capacitor, such that data "0" or "1" is determined depending on whether or not the capacitor is charged with electric charges. Since electric charges charged in the capacitor are lost in a predetermined amount of time, a refresh operation is necessary.

However, because the conventional dynamic memory cell depends on the capacitor, when a memory cell array includes such dynamic memory cells, there is a limit in reducing the physical layout area of the semiconductor memory device.

For this reason, use of a transistor having a floating body has been recently proposed. The transistor stores many carriers in the floating body, and needs to be refreshed because the stored carriers are lost in a predetermined amount of time. Therefore, although a memory cell having the floating body transistor does not include a capacitor, unlike a typical memory cell, the memory cell having the floating body transistor operates in effectively the same manner as the capacitor in order to function as a dynamic memory cell.

As described above, the floating body transistor may constitute a memory cell without using a capacitor. Thus, assuming that a semiconductor memory device having the same capacity is fabricated using each of the two different kinds of memory cells (i.e., the typical memory cell having one transistor and one capacitor, and the memory cell having the floating body transistor), the layout area of a semiconductor memory device including the memory cell having the floating body transistor can be smaller than that of a semiconductor memory device having the typical memory cell.

FIG. 1 illustrates the construction of a conventional memory device including a memory cell having a floating body transistor.

Referring to FIG. 1, the semiconductor memory device includes memory cell array blocks BLK1 and BLK2, bit line selectors 10-11 to 10-1m and 10-21 to 10-2m, reference bit line selectors 12-1 and 12-2, level limiters 14-1 to 14-m, and 14-(m+1), sense amplifiers 16-1 to 16-m, a reference voltage generator 18, comparators COM1 to COMm, latches LA1 to LAm, write back gates WBG1 to WBGm, read column selection gates RG1 to RGm, write column selection gates WG1 to WGm, and a reference write column selection gate RWG.

An operation of writing data to reference memory cells RMC of the semiconductor memory device shown in FIG. 1 will be described.

When a word line WL11 is enabled, a voltage of about 1.5 V is applied and a reference bit line selection signal RBS1 is enabled, a reference bit line RBL1 is connected to a reference sense bit line RSBL. When a reference write column selection signal RWCSL is enabled, an NMOS transistor N7 is turned on so that data transmitted to a write data line WD is transmitted through the reference sense bit line RSBL to the reference bit line RBL1.

At this time, when write data has a voltage of about −1.5 V, data "0" is written to the reference memory cell RMC connected between the word line WL11 and the reference bit line RBL1. In this process, data "0" is written to all reference memory cells RMC connected between the remaining word lines WL12 to WL1n and the reference bit line RBL1. Additionally, data "1" is written to all reference memory cells RMC connected between word lines WL11 to WL1n and WL21 to WL2n and a reference bit line RBL2. In this case, write data has a voltage of about 1.5 V.

In other words, data "0" is written to the reference memory cells RMC connected to a reference bit line RBL1 of each of the reference memory cell array blocks RBLK1 and RBLK2, while data "1" is written to the reference memory cells RMC connected to a reference bit line RBL2 thereof. Thus, the reference memory cells RMC are used to generate a reference voltage VREF in a read operation.

Next, an operation of writing data to memory cells MC will be described.

When a voltage of about 1.5 V is applied to the word line WL11, and a bit line selection signal BS1 is enabled, a bit line BL1 is connected to a sense bit line SBL1. When a write column selection signal WCSL1 is enabled, an NMOS transistor N6 is turned on. At this time, when a voltage of about −1.5 V is applied to the write data line WD, the voltage of about −1.5V is transmitted through the sense bit line SBL1 to the bit line BL1, so that data "0" is written to a memory cell MC connected between the word line WL1 and the bit line BL1. On the other hand, when a voltage of about 1.5 V is applied to the write data line WD, data "1" is written to the memory cell MC connected between the word line WL1 and the bit line BL1. In this process, a write operation is performed on all the memory cells MC.

Next, an operation of reading data from the memory cells MC will be described.

When a voltage of about 1.5 V is applied to the word line WL11 and the bit line selection signal BS1 is enabled, the bit line BL1 is connected to the sense bit line SBL1, and a signal is transmitted from the bit line BL1 to the sense bit line SBL1. The reference bit line selection signals RBS1 and RBS2 are enabled at the same time, and thus the reference bit lines RBL1 and RBL2 are connected to the reference sense bit line RSBL, and a signal is transmitted from the reference bit lines RBL1 and RBL2 to the reference sense bit line RSBL.

When a voltage of the sense bit line SBL1 due to a current supplied to the sense bit line SBL1 is at a higher level than a restricted voltage VBLR, the level limiter 14-1 prevents the flow of current from an output node a1 to the sense bit line SBL1, such that the voltage of the sense bit line SBL1 remains below the level of the restricted voltage VBLR, and generates a current Ic1 corresponding to data stored in the memory cell MC. When a voltage of the reference sense bit line RSBL is at a higher level than the restricted voltage VBLR due to a current supplied to the reference sense bit line RSBL, the level limiter 14-(m+1) prevents the flow of current from an output node a(m+1) to the reference sense bit line RSBL, such that the voltage of the reference sense bit line RSBL remains below the level of the restricted voltage VBLR, and generates a current Ic(m+1) corresponding to data stored in the reference memory cell RMC.

The sense amplifier 16-1 senses the current Ic1 and generates a sensing voltage Sn1. The reference voltage generator 18 senses the current Ic(m+1) and generates a reference voltage VREF. The comparator COM1 is enabled in response to a sense amplifier enable signal SEN, compares the sensing voltage output from the sense amplifier 16-1 with the reference voltage VREF and generates sensing data. Specifically, the comparator COM1 outputs a high-level signal to the corresponding node "a" when the sensing voltage Sn1 output from the sense amplifier 16-1 is at a lower level than the reference voltage VREF, and outputs a low-level signal to the corresponding node "a" when the sensing voltage Sn1 is at a higher level than the reference voltage VREF.

The latch LA1 latches the sensing data, and when a read column selection signal RCSL1 is enabled, NMOS transistors N2 and N4 are turned on. At this time, when a voltage at the node "a" is at a high level, an NMOS transistor N5 is turned on and transmits low-level data to an inverted read data line RDB. On the other hand, when the voltage at a node "b" is at a high level, an NMOS transistor N3 is turned on and transmits the low-level data to a read data line RD. That is, the low-level data is transmitted to the read data line RD or the inverted read data line RDB during a read operation.

After the read operation is finished, when a write back signal WB is enabled, an NMOS transistor N1 is turned on, so that high-level data at the corresponding node "b" of the latch LA1 is transmitted to the sense bit line SBL1, and data in the sense bit line SBL1 is transmitted to the bit line BL1. As a result, a refresh operation is performed on the memory cell MC connected between the word line WL11 and the bit line BL1 and having data "1" stored therein. In this process, the read operation is performed on all the memory cells MC.

A conventional semiconductor memory device as shown in FIG. 1 is described, for example, in U.S. Patent Application Publication No. 2003/0231524. Other examples of semiconductor memory devices including memory cells and reference memory cells with floating body transistors are disclosed in U.S. Patent Application Publication No. 2005/0068807 and U.S. Pat. Nos. 6,567,330 and 6,882,008.

However, the conventional semiconductor memory device shown in FIG. 1, for example, must include the reference memory cells RMC for storing data "0" and the reference memory cells RMC for storing data "1" in order to perform the read operation. Although it is illustrated in FIG. 1 that the semiconductor memory device includes a single reference memory cell for each memory cell array block, the semiconductor memory device may include a single reference memory cell array block for a predetermined number of sub-memory cell array blocks.

Although the conventional semiconductor memory device is designed so that the reference memory cells RMC and the memory cells MC permit the flow of current corresponding to data "0" when the data "0" is read, and permit the flow of current corresponding to data "1" when the data "1" is read, the currents corresponding to the data "0" and "1" vary according to changes in fabrication process, voltage and temperature, so that a read data error may be caused in the reference memory cells RMC and the memory cells MC. That is, a difference may be made between a voltage output from the sense amplifier and the reference voltage VREF, may result in data "0" being read as data "1" and data "1" being read as data "0". This is because the conventional semiconductor memory device senses a current difference between the bit line and the reference bit line during the data read operation.

Also, the conventional semiconductor memory device shown in FIG. 1 requires a complicated circuit configuration for the data read operation. For example, the conventional semiconductor memory device of FIG. 1 requires the level limiters, the sense amplifiers, the comparators and the latches, as shown in FIG. 1.

Furthermore, in the conventional semiconductor memory device shown in FIG. 1, a negative voltage of −1.5 V should be applied to the bit line in order to write data "0". Therefore, the conventional semiconductor memory device requires a negative voltage generator for generating a negative voltage to be applied to the bit line during writing of data "0".

SUMMARY OF THE INVENTION

An aspect of the present invention provides a semiconductor memory device that includes first and second memory cells, a controller and a sensing portion. The first memory cell has a floating body including a gate connected to a word line, a first electrode connected to a bit line, and a second electrode connected to a common source line to store data. The second memory cell has a floating body including a gate connected to the word line, a first electrode connected to an inverted bit line, and a second electrode connected to the common source line to store phase-inverted data of the data. The controller applies a first voltage to the common source line, applies a negative second voltage to the word line, applies a third voltage as a first sense enable control voltage and applies the first voltage as a second sense enable control voltage during a first write period of a write operation. The controller also applies a fourth voltage to the common source line and the first voltage to the word line during a second write period of the write operation. The sensing portion amplifies the bit line and the inverted bit line to the third voltage or the first voltage, respectively, during the first write period in response to the first and second sense enable control voltages. Values of each of the first through fourth voltages may be equal to or higher than a ground voltage.

Data "1" may be written to the first memory cell and the second memory cell due to a gate induced drain leakage (GIDL) current. Data "0" may be written to the first memory cell and the second memory cell due to drain coupling induced hole evacuation (DCIHE).

In an embodiment, the controller may apply the fourth voltage to the common source line and a positive second voltage to the word line during a first read period of a read operation. The controller may apply the first voltage to the common source line, the negative second voltage to the word line, the third voltage as the first sense enable control voltage and the first voltage as the second sense enable control voltage during a second read period of the read operation. The controller may apply the first voltage to the common source line, the first voltage or a negative fifth voltage to the word line, the third voltage as the first sense enable control voltage and the first voltage as the second sense enable control voltage during a third read period of the read operation.

The sensing portion may cut off voltages to the bit line and the inverted bit line during the first read period in response to the first and second sense enable control voltages. The sensing portion may also amplify one of the bit line and the inverted bit line to the third voltage and amplify the other of the bit line and the inverted bit line to the first voltage during the second and third read periods. The controller may apply the negative fifth voltage to the word line, enable a precharge control signal, and generate a precharge voltage before and after each of the write and read operations.

In another embodiment, the controller may apply the fourth voltage to the common source line and a positive second voltage to the word line during a first read period of a read operation. The controller may apply the first voltage to the common source line, the negative second voltage to the word line, the third voltage as the first sense enable control voltage, and the first voltage as the second sense enable control voltage during a second read period of the read operation. The controller may apply the first voltage to the common source line, the negative second voltage to the word line, the third voltage as the first sense enable control voltage, and the first voltage as the second sense enable control voltage during a third read period of the read operation. Further, the controller may apply the fourth voltage to the common source line and the first voltage to the word line during a fourth read period of the read operation.

The sensing portion may cut off voltages to the bit line and the inverted bit line during the first and fourth read periods in response to the first and sense enable control voltages. Also, the sensing portion may amplify one of the bit line and the inverted bit line to the third voltage and may amplify the other of the bit line and the inverted bit line to the first voltage during the second and third read periods.

The controller may apply a negative fifth voltage to the word line, enable a precharge control signal, and generate a precharge voltage before and after each of the write and read operations. Also, the first and second memory cells, which do not perform one of the write and read operations, may receive the negative fifth voltage through the word line.

The sensing portion may precharge the bit line and the inverted bit line to the precharge voltage in response to the precharge control signal. The non-selected word lines may receive the negative fifth voltage. Also, the fifth voltage may be higher than the first voltage, the second voltage may be higher than the fifth voltage, the third voltage may be higher than the second voltage, and the fourth voltage may be about the same as the third voltage.

In an embodiment, the sensing portion may include a bit line isolation gate, a bit line sense amplifier, a precharge unit and a column selection gate. The bit line isolation gate separates the bit line from a sense bit line and separates the inverted bit line from an inverted sense bit line in response to a bit line isolation control signal from the controller. The bit line sense amplifier receives the first and second sense enable control voltages to amplify a voltage difference between the sense bit line and the inverted sense bit line. The precharge unit precharges the sense bit line and the inverted sense bit line to the precharge voltage in response to the precharge control signal. The column selection gate transmits data between the sense bit line and a data input/output line and between the inverted sense bit line and an inverted data input/output line in response to a column selection signal from the controller.

Another aspect of the present invention provides a method of operating a semiconductor memory device, which includes a first memory cell having a floating body including a gate connected to a word line, a first electrode connected to a bit line, and a second electrode connected to a common source line to store data; and a second memory cell having a floating body including a gate connected to the word line, a first electrode connected to an inverted bit line, and a second electrode connected to the common source line to store phase-inverted data of the data. The method includes writing data "1" by applying a first voltage to the common source line, applying a negative second voltage to the word line, and amplifying the bit line and the inverted bit line to a third voltage or the first voltage. The method also includes writing data "0" by applying a fourth voltage to the common source line and applying the first voltage to the word line, the first through fourth voltages having values equal to or higher than a ground voltage.

In an embodiment, the method may further include causing a voltage difference between the bit line and the inverted bit line by applying the fourth voltage to the common source line and applying a positive second voltage to the word line during a first read step; amplifying the voltage difference between the bit line and the inverted bit line by applying the first voltage to the common source line, and applying the negative second voltage to the word line during a second read step; and outputting the amplified voltage difference between the bit line and the inverted bit line by applying the first voltage to the common source line, and applying one of the first voltage and a negative fifth voltage to the word line during a third read step.

After each of the second read step and the third read step, the bit line and the inverted bit line may be precharged to a precharge voltage level by applying the negative fifth voltage to the word line, enabling a precharge control signal, and generating a precharge voltage.

In another embodiment, the method may further include causing a voltage difference between the bit line and the inverted bit line by applying the fourth voltage to the common source line and applying the second voltage to the word line in a first read step; amplifying the voltage difference between the bit line and the inverted bit line by applying the first voltage to the common source line, and applying the negative second voltage to the word line in a second read step; re-storing data "1" and outputting the amplified voltage difference between the bit line and the inverted bit line by applying the first voltage to the common source line, and applying the negative second voltage to the word line in a third read step; and re-storing data "0" by applying the fourth voltage to the common source line and applying the first voltage to the word line in a fourth read step.

After each of the second read step and the fourth read step, the bit line and the inverted bit line may be precharged to a precharge voltage level by applying a negative fifth voltage to the word line, enabling a precharge control signal, and generating a precharge voltage.

The negative fifth voltage may be applied to a word line connected to the first memory cell or the second memory cell that does not perform a write or read operation. The fifth voltage may be higher than the first voltage, the second voltage may be higher than the fifth voltage, the third voltage may be higher than the second voltage, and the fourth voltage may be about the same as the third voltage.

BRIEF DESCRIPTION OF THE DRAWINGS

The embodiments of the present invention will be described with reference to the attached drawings. The drawings are not necessarily to scale, emphasis instead being placed upon illustrating the principles of the invention.

DETAILED DESCRIPTION OF THE EMBODIMENTS

Figure 1:
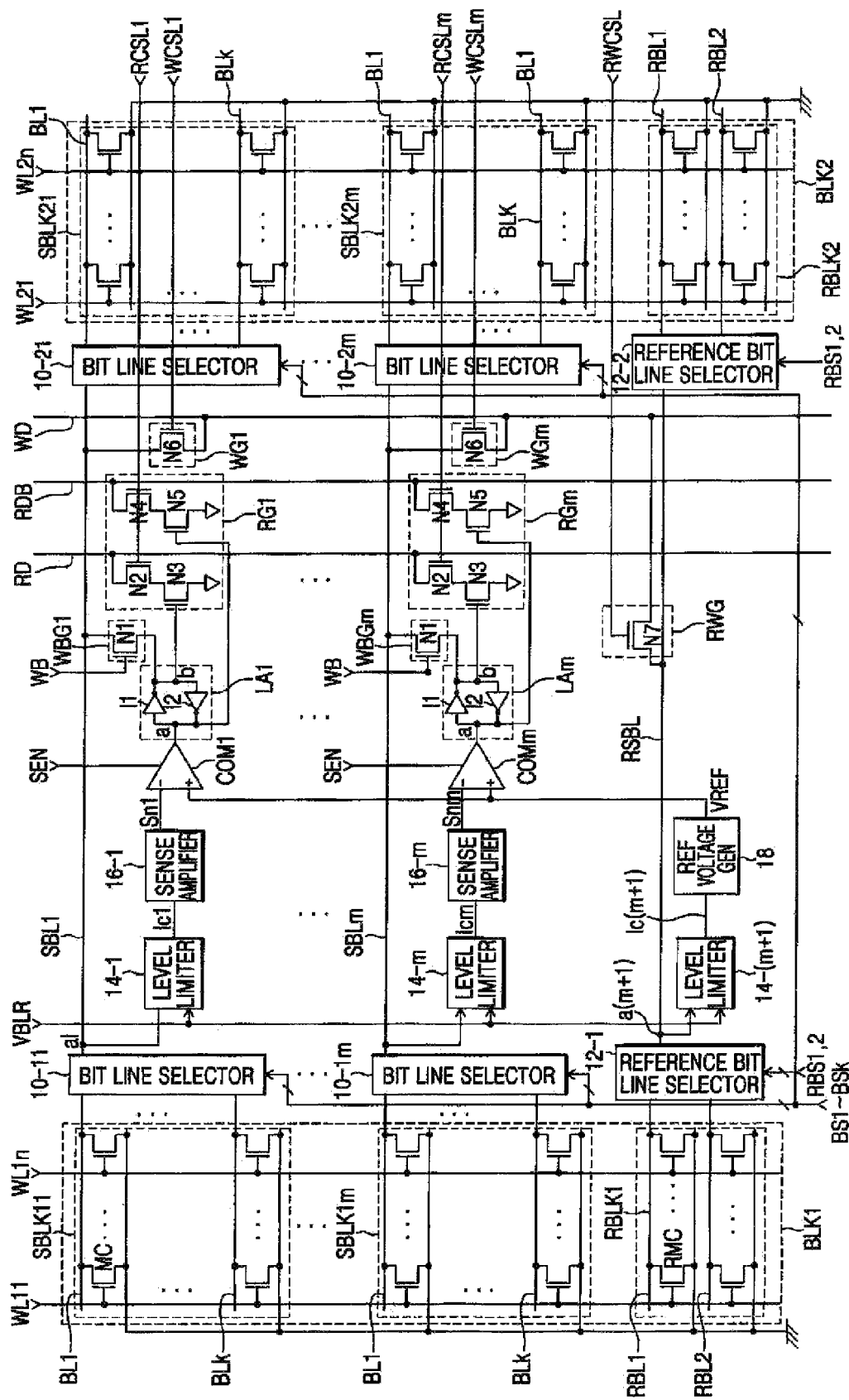
FIG. 1 is a block diagram illustrating a conventional semiconductor memory device, including a memory cell having a floating body transistor.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
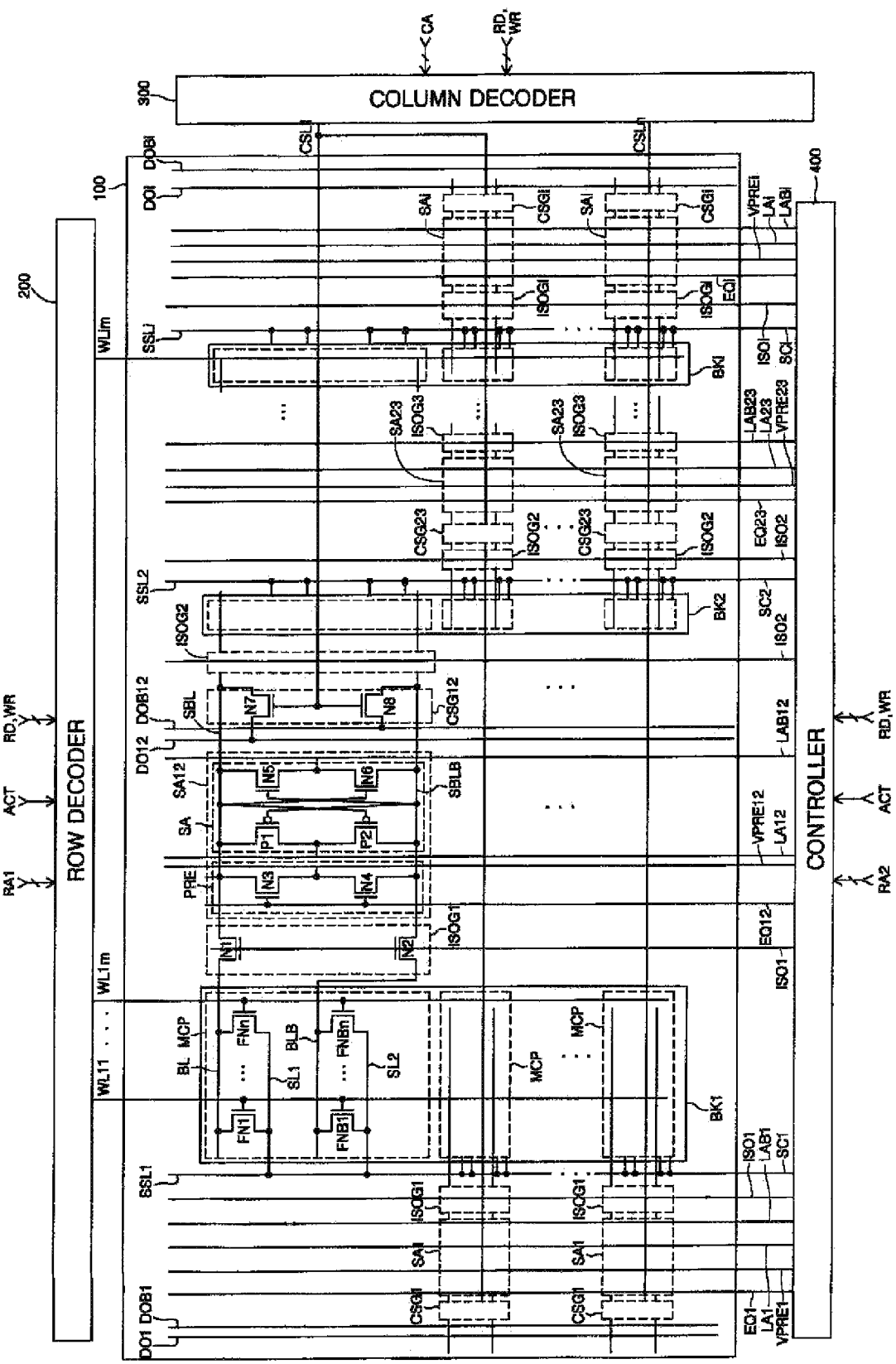
FIG. 2 is a block diagram illustrating a semiconductor memory device, according to an exemplary embodiment of the present invention.

FIG. 2 is a block diagram showing the construction of a semiconductor memory device, according to an illustrative embodiment of the present invention.

Referring to FIG. 2, the semiconductor memory device includes a memory cell array 100, a row decoder 200, a column decoder 300 and a controller 400. The memory cell array 100 includes i memory cell array blocks BK1 to BKi, bit line isolation gates ISOG1 to ISOGi, bit line sense amplifiers SA1, SA12, SA23, . . . , and SAi, and column selection gates CSG1, CSG12, CSG23, . . . , and CSGi. Each of the memory cell array blocks BK1 to BKi includes multiple memory pair groups MCP.

Each of the memory pair groups MCP includes n first memory cells and n second memory cells. The first memory cells include NMOS transistors FN1 to FNn having floating bodies, respectively, for storing data. The NMOS transistors FN1 to FNn include first electrodes (drain/source) connected in common to a bit line BL, second electrodes (source/drain) connected in common to common source lines SSL1, SSL2, . . . , and SSLi, and gates connected to word lines WL1 to WLm, respectively. The second memory cells include NMOS transistors FNB1 to FNBn having floating bodies, respectively, for storing phase-inverted data. The NMOS transistors FNB1 to FNBn include first electrodes (drain/source) connected in common to an inverted bit line BLB, second electrodes (source/drain) connected in common to the common source lines SSL1, SSL2, . . . , and SSLi, and gates connected to the word line WL1 to WLm, respectively.

Each of the bit line isolation gates ISOG1 to ISOGi includes NMOS transistors N1 and N2, and each of the bit line sense amplifiers SA1, SA12, SA23, and SAi includes a precharge circuit PRE and an amplification circuit SA. The precharge circuit PRE includes NMOS transistors N3 and N4. The amplification circuit SA includes a PMOS sense amplifier, which has PMOS transistors P1 and P2, and an NMOS sense amplifier, which has NMOS transistors N5 and N6. Also, each of the column selection gates CSG1, CSG12, CSG23, . . . , and CSGi includes NMOS transistors N7 and N8.

Functions of the blocks shown in FIG. 2 will now be described.

The memory cell array 100 writes data to two pairs of memory cells, which are connected to a selected word line and two bit line pairs BL and BLB selected by a column selection signal, or reads data from the two pairs of memory cells. The memory cell array block BK1 writes data transmitted through two data input/output line pairs (DO1, DOB1) and (DO12, DOB12) and reads the stored data through the two data input/output line pairs (DO1, DOB1) and (DO12, DOB12). Each of the memory cell array blocks BK2 to BKi inputs and outputs data through two data input/output line pairs (DO12, DOB12), . . . , and (DOi, DOBi), located at both sides of each.

The row decoder 200 receives an active command ACT, decodes a first row address RA1, and enables a word line selection signal of one of the word lines WL11 to WL1m, . . . , and WLim. The row decoder 200 may be configured such that the enabling period of the word line selection signal is fixed irrespective of a read command RD and a write command WR. Alternatively, the row decoder 200 may be configured such that the enabling period of the word line selection signal varies according to the read command RD and the write command WR. The column decoder 300 receives the read command RD or the write command WR, decodes a column address CA, and generates a column selection signal for selecting column selection signal lines CSL1 to CSLn.

The controller 400 receives the active command ACT, decodes a second row address RA2 for designating the memory cell array blocks BK1 to BKi, and generates bit line isolation control signals ISO1 to ISOi, sense enable control voltages (LA1, LAB1), (LA12, LAB12), (LA23, LAB23), . . . , and (LAi, LABi), common source control signals SC1 to SCi, precharge signals EQ1, EQ12, EQ23, . . . , and EQi, and precharge voltages VPRE1, VPRE12, VPRE23, . . . , and VPREi.

When the second row address RA2 is an address for designating the memory cell array block BK1, for example, the controller 400 applies the same voltage to the bit line isolation control signal ISO1, the sense enable control voltages (LA1, LAB1) and the sense enable control voltages (LA12, LAB12) irrespective of the read command RD and the write command WR, and applies different voltages to the common source control signal SC1 in response to the read command RD and the write command WR. Also, the controller 400 controls the enabling period of the bit line isolation control signal ISO1 and the voltage application periods of the sense enable control voltages (LA1, LAB1) and (LA12, LAB12) according to the read command RD and the write command WR. In other words, the controller 400 enables the bit line isolation control signals ISO1 to ISOi on both sides of the memory cell array block BK1 to BKi designated by the second row address RA2, applies a voltage having a predetermined level as the sense enable control voltage, and applies a voltage as the common source control signal SC1 to SCi of the memory cell array block BK1 to BKi designated by the second row address RA2.

The bit line isolation gates ISOG1 to ISOGi are turned on in response to the bit line isolation control signals ISO1 to ISOi, respectively, and connect the bit line pair BL and BLB with a pair of sense bit lines SBL and SBLB. The bit line isolation control signals ISO1 to ISOi are enabled when the corresponding memory cell array blocks BK1 to BKi are designated. For example, when the memory cell array block BK1 is designated, the bit line isolation control signal ISO1 is enabled to turn on the NMOS transistors N1 and N2 of the bit line isolation gate ISOG1.

The precharge circuits PRE of the bit line sense amplifiers SA1, SA12, SA23, . . . , and SAi precharge the voltages of the corresponding sense bit line pair SBL and SBLB to the levels of precharge voltages VPRE1, VPRE12, VPRE23, . . . , and VPREi in response to the precharge control signals EQ1, EQ12, EQ23, . . . , and EQi, respectively, before and after read and write operations. For example, when the memory cell array block BK1 is designated and the read command RD is applied, the precharge control signals EQ1 and EQ12 are enabled before and after the read operation. Thus, the corresponding sense bit line pair SBL and SBLB are precharged to the precharge voltages VPRE1 and VPRE12. Further, the row decoder 200 may apply a small negative voltage, e.g., about −0.5 V, to the word lines after each of the read and write operations.

The amplification circuits SA of the bit line sense amplifiers SA1, SA12, SA23, . . . , and SAi sense a voltage difference between the sense bit line pair SBL and SBLB and amplify data of the sense bit line pair SBL and SBLB in response to the sense enable control voltages (LA1, LAB1), (LA12, LAB12), (LA23, LAB23), and (LAi, LABi), respectively. For example, when the memory cell array block BK1 is designated, the sense enable control voltages (LA1, LAB1) and (LA12, LAB12) are applied to the amplification circuits SA of the bit line sense amplifiers SA1, SA12, and when the memory cell array block BK2 is designated, the sense enable control voltages (LA12, LAB12) and (LA23, LAB23) are applied to the amplification circuits SA of the bit line sense amplifiers SA12, SA23. The column selection gates CSG1, CSG12, CSG23, . . . , and CSGi connect the sense bit line pair SBL and SBLB with the corresponding data input/output line pair (DO1, DOB1), (DO12, DOB12), (DO23, DOB23), . . . , and (DOi, DOBi), respectively, in response to column selection signals for selecting the column selection signal lines CSL1 to CSLn.

Figure 3A:
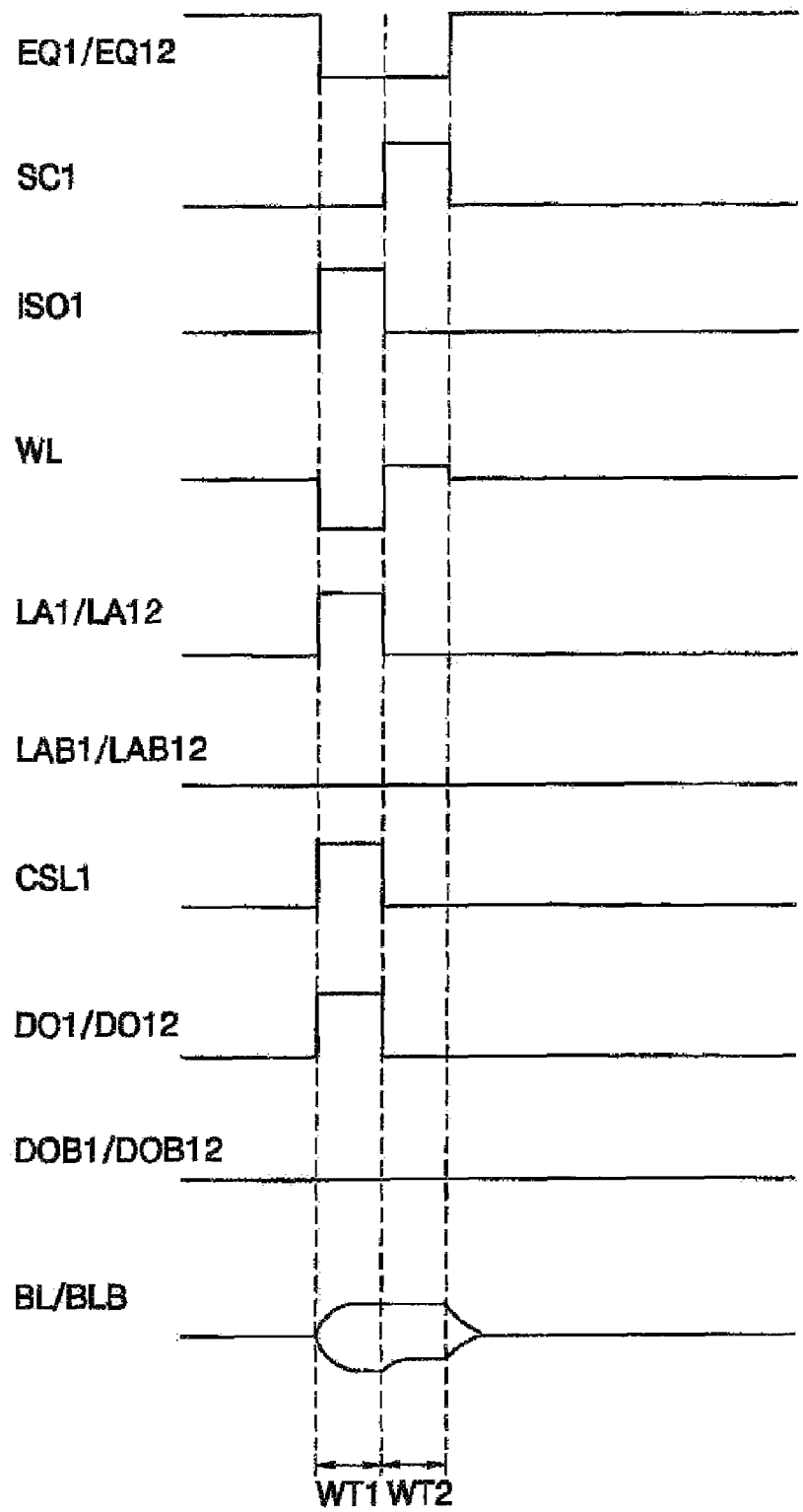
FIGS. 3A and 3B are timing diagrams illustrating a data write operation and a data read operation of the semiconductor memory device shown in FIG. 2, according to an exemplary embodiment of the present invention.

FIG. 3A is a timing diagram illustrating a data write operation of the semiconductor memory device shown in FIG. 2, according to an illustrative embodiment of the present invention. The data write operation is performed when the first row address RA1 for selecting the word line WL11 and the second row address RA2 for designating the memory cell array block BK1 are applied along with the active command ACT, and the column address CA for selecting the column selection signal line CSL1 is applied along with the write command WR.

During a first write period WT1, the row decoder 200 decodes the first row address RA1 and generates a word line selection signal WL having a predetermined negative voltage of about −1.8 V or −2 V for selecting the word line WL11. Also, the unselected word lines WL12, . . . , and WL1m are maintained at a predetermined negative voltage of about −0.5 V.

The controller 400 receives the second row address RA2, generates the bit line isolation control signal ISO1 with a voltage for turning on the NMOS transistors N1 and N2 of the bit line isolation gates ISOG1 disposed at both sides of the memory cell array block BK1, and generates the common source control signal SC1 with a predetermined voltage of about 0 V provided to the common source line SSL1. The controller 400 also generates sense enable control voltages LA1 and LA12 with a predetermined voltage of about 2 V and sense enable control voltages LAB1 and LAB12 with a predetermined voltage of about 0 V provided to the bit line sense amplifiers SA1 and SA12.

The column decoder 300 decodes the column address CA and generates the column selection signal for selecting the column selection signal line CSL1. Then, the column selection gates CSG1 and CSG12 are turned on so that pairs of high- and low-level data of the data input/output line pairs (DO1, DOB1) and (DO12, DOB12) are transmitted to the sense bit line pairs (SBL, SBLB), respectively. The data pairs of the sense bit line pairs (SBL, SBLB) are amplified by the bit line sense amplifiers (SA1, SA12), and thus sense bit lines SBL are at a voltage level of about 2 V and inverted sense bit lines SBLB are at a voltage level of about 0 V. Also, since the NMOS transistors N1 and N2 of the bit line isolation gates ISOG1 are turned on, voltages of the sense bit line pairs (SBL, SBLB) are transmitted to the bit line pairs (BL, BLB).

Accordingly, a negative voltage is applied to gates of the memory cells FN1 of the two memory pair groups MCP of the memory cell array block BK1, while a positive voltage is applied to drains of the memory cells FN1. As a result, a gate-induced drain leakage (GIDL) current is generated, so that holes are accumulated in the floating bodies of the memory cells FN1 to write data "1". In other words, an operation of writing data "1" is performed during the first write period WT1. Here, the NMOS transistors of the memory cells FN1 in which the data "1" is written remain turned off because a predetermined negative voltage of about −1.8 V or −2 V is being applied to the gates of the NMOS transistors of the memory cells FN1. Also, since the data "1" is written due to the GIDL current, hardly any current is consumed.

During a second write period WT2, the controller 400 disables the bit line isolation control signal ISO1 and cuts off the application of the sense enable control signals (LA1, LAB1) and (LA12, LAB12). The column decoder 300 decodes the column address CA and disables the column selection signal for selecting the column selection signal line CSL1.

Also during the second write period WT2, the bit lines BL of each of the two memory pair groups MCP are charged with a predetermined voltage of about 2 V, while the inverted bit lines BLB of each of the two memory pair groups MCP are charged with a predetermined voltage of about 0 V. In this case, the controller 400 generates the common source control signal SC1 with a predetermined voltage of about 2 V to the common source line SSL1, and the row decoder 200 generates the word line selection signal WL with a predetermined voltage of about 0 V.

A positive voltage is applied to the sources and drains of the memory cells FN1 that are connected to the bit lines BL and the common source line SSL1 of the two memory pair groups MCP, and a predetermined voltage of about 0 V is applied to the gates of the memory cells FN1, so that the memory cells FN1 remain the same. However, a positive voltage is applied to sources of the memory cells FNB1 that are connected to the common source line SSL1, while a predetermined voltage of about 0 V is applied to the gates and drains of the memory cells FNB1. Thus, a reverse bias is applied between the sources and bodies of the memory cells FNB1 that are connected to the inverted bit lines BLB of the two memory pair groups MCP, so that a depletion region is formed. As a result, holes existing in the bodies of the memory cells FNB1 are evacuated to the drains thereof because of the depletion region. In particular, a drain coupling induced hole evacuation (DCIHE) phenomenon occurs, thus writing data "0" to the memory cells FNB1.

Because a predetermined voltage of about 0 V is applied to the gates of the NMOS transistors of the memory cells FNB1 in which the data "0" is written, the NMOS transistors of the memory cells FNB1 remain turned off, resulting in hardly any current consumption. In this case, a predetermined voltage of about −0.5 V is applied to the unselected word lines WL12, . . . , and WL1m. Thus, even when a positive voltage is applied to the sources of the memory cells FNB1, the number of holes evacuated to the drains of the memory cells FNB1 is so small that data in the memory cells FNB1 connected to the unselected word lines WL12, . . . , and WL1m of the same inverted bit lines BLB remain unchanged.

When data is written to the memory cells FN1 and FNB1, the NMOS transistors N3 and N4 of the precharge circuit PRE are turned on in response to the precharge control signals EQ1 and EQ12 from the controller 400 and precharge voltages of the sense bit line pairs (SBL, SBLB) and the bit line pairs (BL, BLB) to the levels of precharge voltages VPRE1 and VPRE12 of about 1 V.

Figure 3B:
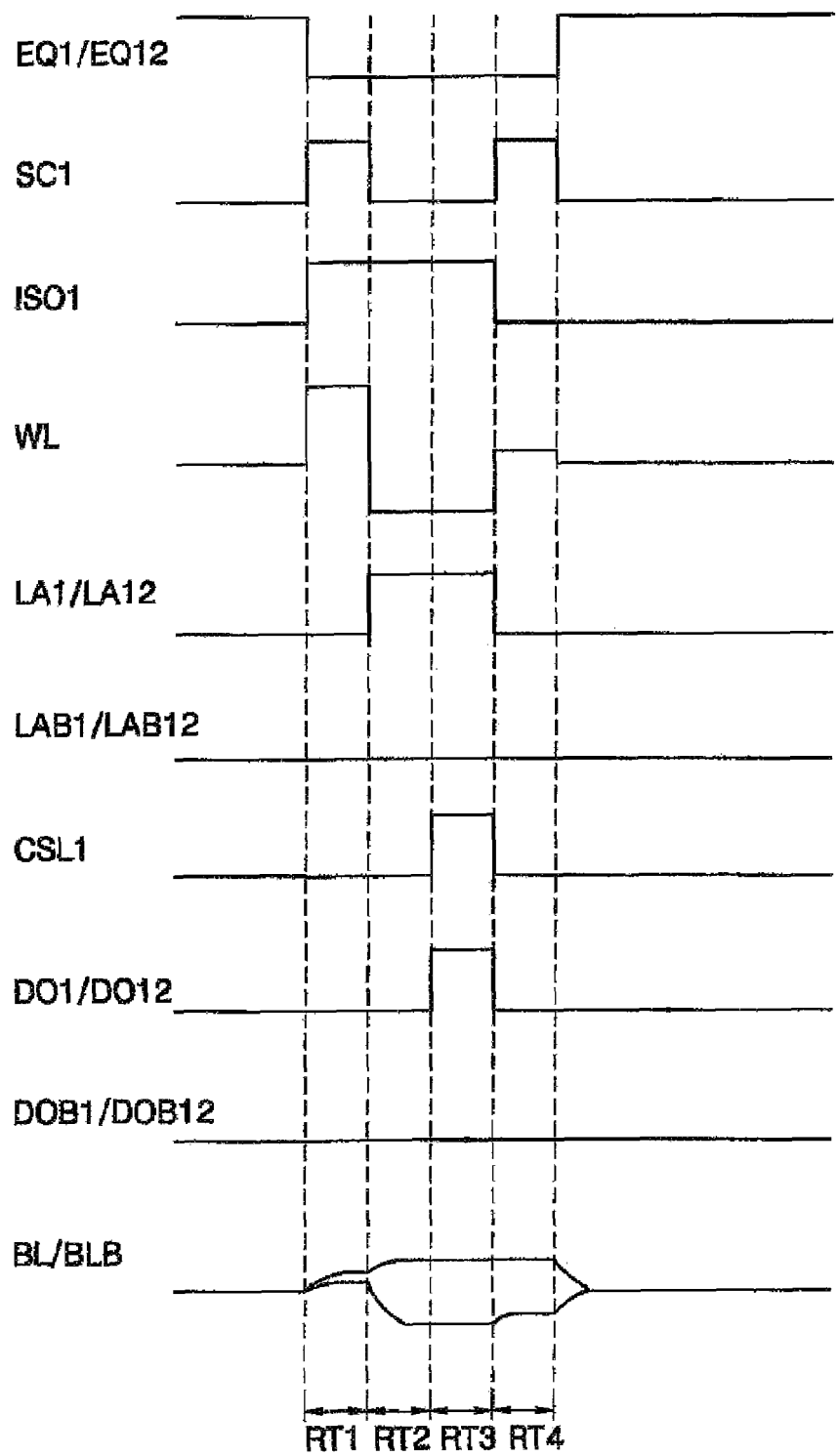

FIG. 3B is a timing diagram illustrating a data read operation of the semiconductor memory device shown in FIG. 2, according to an illustrative embodiment of the present invention. The data read operation is performed to read the data "1" stored in the memory cells FN1 of the two memory pair groups of the memory cell array block BK1 and the data "0"

stored in the memory cells FNB1 of the two memory pair groups of the memory cell array block BK1 resulting from the data write operation described above with respect to FIG. 3A.

During a first read period RT1, the controller 400 receives the second row address RA2, generates the bit line isolation control signal ISO1 with a voltage level for turning on the NMOS transistors N1 and N2 of the bit line isolation gates ISOG1 positioned at both sides of the memory cell array block BK1, and generates the common source control signal SC1 with a predetermined voltage of about 2 V provided to the common source line SSL1. The row decoder 200 decodes the first row address RA1 and generates the word line selection signal WL with a predetermined voltage of about 1.8 or 2 V for the selected word line WL11.

Since the common source control signal SC1 with the predetermined voltage of about 2 V is applied to the common source line SSL1, the bit lines BL are at a voltage level of 2V-Vth1, and the inverted bit lines BLB are at a voltage level of 2 V-Vth0. Here, the voltage Vth1 refers to the threshold voltage of the memory cell FN1 in which data "1" is stored, while the voltage Vth0 refers to the threshold voltage of the memory cell FNB1 in which data "0" is stored. The threshold voltage of the memory cell FN1 in which the data "1" is stored is lower than that of the memory cell FNB1 in which the data "0" is stored. As a result, the voltage of the bit lines BL of the two memory pair groups of the memory cell array block BK1 becomes higher than that of the inverted bit lines BLB, thus causing a voltage difference of ΔV. In this case, since the bit line isolation gates ISOG1 are turned on, the voltage of the sense bit lines SBL also becomes higher than the voltage of the inverted sense bit lines SBLB. During the first read period RT1, a charge operation is performed on the bit lines BL and inverted bit lines BLB of the two memory pair groups.

During a second read period RT2, the controller 400 generates the common source control signal SC1 with a predetermined voltage of about 0 V provided to the common source line SSL1, and the row decoder 200 generates the word line selection signal WL with a negative voltage of about −1.8 or −2 V provided to the selected word line WL11. Also, the controller 400 generates predetermined sense enable control voltages LA1 and LA12 of about 2 V and predetermined sense enable control voltages LAB1 and LAB12 of about 0 V provided to the sense amplifiers SA1 and SA12 positioned at both sides of the memory cell array block BK1.

The sense amplifiers SA1 and SA12 sense a high-level voltage of the sense bit lines SBL and amplify the voltage of the inverted sense bit lines SBLB to a predetermined voltage of about 0 V. Also, the sense amplifiers SA1 and SA12 sense a low-level voltage of the inverted sense bit lines SBLB and amplify the voltage of the sense bit lines SBL to a predetermined voltage of about 2 V. At this time, since the NMOS transistors N1 and N2 of the bit line isolation gates ISOG1 are turned on, the bit lines BL and the inverted bit lines BLB are also amplified to the same level as the sense bit lines SBL and the inverted sense bit lines SBLB, respectively. In the second read period RT2, an amplification operation is performed on the bit line pairs BL and BLB and the sense bit line pairs SBL and SBLB.

During a third read period RT3, the column decoder 300 decodes the column address CA and generates the column selection signal for selecting the column selection signal line CSL1. Then, the column selection gates CSG1 and CSG12, located at both sides of the memory cell array block BK1, are turned on and transmit data in the sense bit line pairs SBL and SBLB of the two memory pair groups to the data input/output line pairs (DO1, DOB1) and (DO12, DOB12).

During a fourth read period RT4, the controller 400 generates the bit line isolation control signal ISO1 with a voltage level for turning off the bit line isolation gates ISOG1 and cuts off the application of the sense enable control voltages (LA1, LAB1) and (LA12, LAB12). Also, the controller 400 generates the common source control signal SC1 with a predetermined voltage of about 2 V provided to the common source line SSL1. The column decoder 300 disables the column selection signal for selecting the column selection signal line CSL1, and the row decoder 200 generates a word line selection signal WL for selecting the word line WL11 with a predetermined voltage of about 0 V.

During the second and third read periods RT2 and RT3, a negative voltage is applied to the gates of the memory cells FN1 of the two memory pair groups, a positive voltage is applied to the bit lines, and a predetermined voltage of about 0 V is applied to the common source lines SSL1. Thus, a GIDL current is generated in the memory cells FN1 so that data "1" is stored again.

During the fourth read period RT4, although the bit line isolation gates ISOG1 are turned off, the bit lines BL of each of the two memory pair groups are charged with a predetermined voltage of about 2 V, while the inverted bit lines BLB of each of the two memory pair groups are charged with a predetermined voltage of about 0 V. Since the common source control signal SC1 with a predetermined voltage of about 2 V is applied to the common source line SSL1 and the word line selection signal WL with a predetermined voltage of about 0 V is applied to the selected word WL11, the same conditions are made as in the second write period WT2 described with reference to FIG. 3A.

Specifically, a positive voltage is applied to the sources and drains of the memory cells FN1 that are connected to the bit lines BL of the two memory pair groups MCP, and a predetermined voltage of about 0 V is applied to the gates of the memory cells FN1, so that the memory cells FN1 remain the same. Also, a positive voltage is applied to the sources of the memory cells FNB1 that are connected to the inverted bit lines BLB, while a predetermined voltage of about 0 V is applied to the gates and drains of the memory cells FNB1. Thus, a reverse bias is applied between the sources and bodies of the memory cells FNB1 that are connected to the inverted bit lines BLB of the two memory pair groups MCP, so that a depletion region is formed. As a result, holes existing in the bodies of the memory cells FNB1 are evacuated to the drains of the memory cells FNB1 owing to the depletion region, that is, a DCIHE phenomenon occurs, thus writing data "0" to the memory cells FNB1 again.

In this case, because a predetermined voltage of about −0.5 V is applied to the unselected word lines WL12, . . . , and WL1m, even when a positive voltage is applied to the sources of the memory cells FNB1, the number of holes evacuated to the drains of the memory cells FNB1 is so small that data in the memory cells FNB1 connected to the unselected word lines WL12, . . . , and WL1m of the same inverted bit lines BLB remain unchanged. During the fourth read period RT4, the data "0" is re-written to the memory cells FNB1.

Further, during the fourth read period RT4, when data "0" is written to the memory cells FNB1, the NMOS transistors N3 and N4 of the precharge circuit PRE are turned on in response to the precharge control signals EQ1 and EQ12 from the controller 400 and precharge voltages of the sense bit line pairs (SBL, SBLB) and the bit line pairs (BL, BLB) to the levels of precharge voltages VPRE1 and VPRE12 of about 1 V.

In FIG. 3B, data "1" and data "0" are re-stored in the third and fourth read periods RT3 and RT4 of the data read operation. However, considering that data is theoretically stored in a memory cell having a floating body by varying the threshold voltage Vth of a transistor of the memory cell, since the threshold voltage is not varied during the data read operation, the data re-storing period may be omitted in an embodiment of the invention. Specifically, during the third read period RT3 described with reference to FIG. 3B, the controller 400 may apply a predetermined voltage of about 0 V or a small negative voltage, such as about −0.5 V, to the selected word line WL11, rather than the negative voltage of about −1.8 or −2 V, so that the data "1" may not be re-stored. Also, the fourth read period RT4 may be omitted, in an embodiment of the invention.

In the semiconductor memory device of the embodiment described above, a predetermined voltage of about 2 V is applied to the common source line SSL1 to write (re-store) data "0" using a DCIHE phenomenon, instead of writing (re-storing) data "0" by applying a negative voltage to the bit lines (inverted bit lines). Also, data "1" is written (re-stored) using a GIDL current.

Furthermore, in the semiconductor memory device according to the exemplary embodiment, a predetermined voltage of about 2 V is applied to the common source line SSL1 to read data, thus causing a voltage difference between the bit line pair. Then, the voltage difference between the bit line pair is amplified to read data. An operation of writing data "0" to a memory cell by use of DCIHE does not result in great driving capability, but the operation consumes hardly any current. Also, during a data read operation, data is determined not by consuming current, but by amplifying a voltage difference between a bit line BL and an inverted bit line BLB. Thus, the driving capability is not of concern during the writing of data "0".

In FIG. 2, the memory cell array 100 of the semiconductor memory device is configured such that one memory cell array block is selected and two data pairs are output from the selected memory cell array block. However, the memory cell array may have alternative configurations according to various embodiments. For example, the memory cell array may be configured such that 8 data pairs may be output from two memory cell array blocks.

The memory cell array of the semiconductor memory device according to embodiments of the present invention may include the memory pair groups shown in FIG. 2, bit line isolation gates, and a precharge circuit, as well as bit line sense amplifiers and column selection gates. Also, the exemplary voltage levels of the above description may be changed to various other voltage levels, without departing from the spirit and scope of the present invention.

According to embodiments of the present invention, a semiconductor memory device, including a capacitor-less dynamic memory cell, requires only a simple circuit configuration for a data read operation or data write operation. Also, the semiconductor memory device has an excellent sensing margin because a sensing operation is performed using a difference in threshold voltages between a memory cell in which data "1" is written and a memory cell in which data "0" is written, for example, by applying a voltage to a common source line during the read operation.

Further, the semiconductor memory device according to embodiments of the present invention does not need a negative voltage generator for a bit line because it is unnecessary to apply a negative voltage to the bit line during writing (or re-storing) of data "0". In addition, hardly any current is consumed during the write operation, thus reducing power consumption.

Embodiments of the present invention have been disclosed herein and, although specific terms are employed, they are used and are to be interpreted in a generic and descriptive sense and not for purpose of limitation. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device comprising:
 a first memory cell including a floating body comprising a gate connected to a word line, a first electrode connected to a bit line, and a second electrode connected to a common source line to store data;
 a second memory cell including a floating body comprising a gate connected to the word line, a first electrode connected to an inverted bit line, and a second electrode connected to the common source line to store phase-inverted data of the data;
 a controller for applying a first voltage to the common source line, applying a negative second voltage to the word line, applying a third voltage as a first sense enable control voltage and applying the first voltage as a second sense enable control voltage during a first write period of a write operation, and for applying a fourth voltage to the common source line and applying the first voltage to the word line during a second write period of the write operation; and
 a sensing portion for amplifying the bit line and the inverted bit line to the third voltage or the first voltage, respectively, during the first write period in response to the first and second sense enable control voltages
 wherein the first through fourth voltages being equal to or higher than a ground voltage.

2. The device according to claim 1, wherein data "1" is written to the first memory cell and the second memory cell due to a gate induced drain leakage (GIDL) current, and data "0" is written to the first memory cell and the second memory cell due to drain coupling induced hole evacuation (DCIHE).

3. The device according to claim 1, wherein the controller:
 applies the fourth voltage to the common source line and applies a positive second voltage to the word line during a first read period of a read operation;
 applies the first voltage to the common source line, applies the negative second voltage to the word line, applies the third voltage as the first sense enable control voltage and applies the first voltage as the second sense enable control voltage during a second read period of the read operation; and
 applies the first voltage to the common source line, applies the first voltage or a negative fifth voltage to the word line, applies the third voltage as the first sense enable control voltage and applies the first voltage as the second sense enable control voltage during a third read period of the read operation.

4. The device according to claim 3, wherein the sensing portion cuts off voltages to the bit line and the inverted bit line during the first read period in response to the first and second sense enable control voltages, and amplifies one of the bit line and the inverted bit line to the third voltage and amplifies the other of the bit line and the inverted bit line to the first voltage during the second and third read periods.

5. The device according to claim 4, wherein the controller applies the negative fifth voltage to the word line, enables a precharge control signal, and generates a precharge voltage before and after each of the write and read operations.

6. The device according to claim 5, wherein the sensing portion precharges the bit line and the inverted bit line to the precharge voltage in response to the precharge control signal.

7. The device according to claim 5, wherein non-selected word lines receive the negative fifth voltage.

8. The device according to claim 7, wherein the fifth voltage is higher than the first voltage, the second voltage is higher than the fifth voltage, the third voltage is higher than the second voltage, and the fourth voltage is about the same as the third voltage.

9. The device according to claim 5, wherein the sensing portion comprises:
   a bit line isolation gate for separating the bit line from a sense bit line and for separating the inverted bit line from an inverted sense bit line in response to a bit line isolation control signal from the controller;
   a bit line sense amplifier for receiving the first and second sense enable control voltages to amplify a voltage difference between the sense bit line and the inverted sense bit line;
   a precharge unit for precharging the sense bit line and the inverted sense bit line to the precharge voltage in response to the precharge control signal; and
   a column selection gate for transmitting data between the sense bit line and a data input/output line and between the inverted sense bit line and an inverted data input/output line in response to a column selection signal from the controller.

10. The device according to claim 1, wherein the controller:
   applies the fourth voltage to the common source line and applies a positive second voltage to the word line during a first read period of a read operation;
   applies the first voltage to the common source line, applies the negative second voltage to the word line, applies the third voltage as the first sense enable control voltage, and applies the first voltage as the second sense enable control voltage during a second read period of the read operation;
   applies the first voltage to the common source line, applies the negative second voltage to the word line, applies the third voltage as the first sense enable control voltage, and applies the first voltage as the second sense enable control voltage during a third read period of the read operation; and
   applies the fourth voltage to the common source line and applies the first voltage to the word line during a fourth read period of the read operation.

11. The device according to claim 10, wherein the sensing portion cuts off voltages to the bit line and the inverted bit line during the first and fourth read periods in response to the first and sense enable control voltages, and amplifies one of the bit line and the inverted bit line to the third voltage and amplifies the other of the bit line and the inverted bit line to the first voltage during the second and third read periods.

12. The device according to claim 11, wherein the controller applies a negative fifth voltage to the word line, enables a precharge control signal, and generates a precharge voltage before and after each of the write and read operations.

13. The device according to claim 12, wherein the sensing portion comprises:
   a bit line isolation gate for separating the bit line from a sense bit line and for separating the inverted bit line from an inverted sense bit line in response to a bit line isolation control signal from the controller;
   a bit line sense amplifier for receiving the first and second sense enable control voltages to amplify a voltage difference between the sense bit line and the inverted sense bit line;
   a precharge unit for precharging the sense bit line and the inverted sense bit line to the precharge voltage in response to the precharge control signal; and
   a column selection gate for transmitting data between the sense bit line and a data input/output line and between the inverted sense bit line and an inverted data input/output line in response to a column selection signal from the controller.

14. A method of operating a semiconductor memory device, comprising a first memory cell having a floating body including a gate connected to a word line, a first electrode connected to a bit line and a second electrode connected to a common source line to store data, and a second memory cell having a floating body including a gate connected to the word line, a first electrode connected to an inverted bit line and a second electrode connected to the common source line to store phase-inverted data of the data, the method comprising:
   writing data "1" by applying a first voltage to the common source line, applying a negative second voltage to the word line, and amplifying the bit line and the inverted bit line to a third voltage or the first voltage; and
   writing data "0" by applying a fourth voltage to the common source line and applying the first voltage to the word line, the first through fourth voltages having values equal to or higher than a ground voltage.

15. The method according to claim 14, further comprising:
   causing a voltage difference between the bit line and the inverted bit line by applying the fourth voltage to the common source line and applying a positive second voltage to the word line during a first read step;
   amplifying the voltage difference between the bit line and the inverted bit line by applying the first voltage to the common source line, and applying the negative second voltage to the word line during a second read step; and
   outputting the amplified voltage difference between the bit line and the inverted bit line by applying the first voltage to the common source line, and applying one of the first voltage and a negative fifth voltage to the word line during a third read step.

16. The method according to claim 15, further comprising:
   after each of the second read step and the third read step, precharging the bit line and the inverted bit line to a precharge voltage level by applying the negative fifth voltage to the word line, enabling a precharge control signal, and generating a precharge voltage.

17. The method according to claim 16, wherein the negative fifth voltage is applied to a word line connected to the first memory cell or the second memory cell that does not perform a write or read operation.

18. The method according to claim 17, wherein the fifth voltage is higher than the first voltage, the second voltage is higher than the fifth voltage, the third voltage is higher than the second voltage, and the fourth voltage is about the same as the third voltage.

19. The method according to claim 14, further comprising:
   causing a voltage difference between the bit line and the inverted bit line by applying the fourth voltage to the common source line and applying the second voltage to the word line in a first read step;
   amplifying the voltage difference between the bit line and the inverted bit line by applying the first voltage to the common source line, and applying the negative second voltage to the word line in a second read step;

re-storing data "1" and outputting the amplified voltage difference between the bit line and the inverted bit line by applying the first voltage to the common source line, and applying the negative second voltage to the word line in a third read step; and re-storing data "0" by applying the fourth voltage to the common source line and applying the first voltage to the word line in a fourth read step.

20. The method according to claim 19, further comprising:
after each of the second read step and the fourth read step, precharging the bit line and the inverted bit line to a precharge voltage level by applying a negative fifth voltage to the word line, enabling a precharge control signal, and generating a precharge voltage.

* * * * *